(12) United States Patent
Chang et al.

(10) Patent No.: US 11,695,018 B2
(45) Date of Patent: Jul. 4, 2023

(54) DISPLAY APPARATUS

(71) Applicant: E Ink Holdings Inc., Hsinchu (TW)

(72) Inventors: Chia-Chi Chang, Hsinchu (TW);
Chih-Chun Chen, Hsinchu (TW);
Chi-Ming Wu, Hsinchu (TW);
Yi-Ching Wang, Hsinchu (TW);
Jia-Hung Chen, Hsinchu (TW);
Bo-Tsang Huang, Hsinchu (TW);
Wei-Yueh Ku, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 261 days.

(21) Appl. No.: 16/907,322

(22) Filed: Jun. 22, 2020

(65) Prior Publication Data

US 2020/0411561 A1 Dec. 31, 2020

Related U.S. Application Data

(60) Provisional application No. 62/867,903, filed on Jun. 28, 2019.

(51) Int. Cl.
*H01L 27/12* (2006.01)
*G02F 1/1362* (2006.01)
*H01L 27/02* (2006.01)

(52) U.S. Cl.
CPC .......... *H01L 27/124* (2013.01); *G02F 1/1362* (2013.01); *G02F 1/136286* (2013.01); *H01L 27/0296* (2013.01); *G02F 1/136204* (2013.01); *G09G 2370/16* (2013.01)

(58) Field of Classification Search
None
See application file for complete search history.

(56) References Cited

U.S. PATENT DOCUMENTS

| 9,715,317 | B2 | 7/2017 | Park |
| 9,798,968 | B2 | 10/2017 | Finn et al. |
| 9,960,476 | B2 | 5/2018 | Finn et al. |
| 2012/0075214 | A1* | 3/2012 | Kim ........................ G06F 3/041 345/173 |
| 2013/0050173 | A1 | 2/2013 | Koo |

(Continued)

FOREIGN PATENT DOCUMENTS

| CN | 105224136 A | 1/2016 |
| CN | 107422561 A | 12/2017 |
| CN | 107870493 A | 4/2018 |

(Continued)

OTHER PUBLICATIONS

Corresponding Chinese office action dated Aug. 26, 2021.
Corresponding Taiwan office action dated Mar. 22, 2021.

*Primary Examiner* — Duane N Taylor, Jr.
(74) *Attorney, Agent, or Firm* — CKC & Partners Co., LLC

(57) ABSTRACT

A display apparatus includes a wireless transmission unit and a display panel. The display panel includes a substrate, a plurality of pixel units and a signal line. The substrate includes a display region and a periphery region. The periphery region surrounds the display region. The pixel units are disposed on the display region. Each of the pixel units includes an active device and a pixel electrode. The active device is electrically connected to the pixel electrode. The signal line is on the periphery region. As viewed from a top view, the signal line has an annular shape having a gap and surrounds the display region.

10 Claims, 8 Drawing Sheets

(56) References Cited

U.S. PATENT DOCUMENTS

2015/0269477 A1    9/2015   Finn et al.
2017/0277309 A1*   9/2017   Park ...................... G06F 3/0446

FOREIGN PATENT DOCUMENTS

| CN | 109884828 A | 6/2019 |
|----|-------------|--------|
| CN | 110930927 A | 3/2020 |
| TW | M512726 U | 11/2015 |
| TW | 201918767 A | 5/2019 |

* cited by examiner

DISPLAY APPARATUS

CROSS-REFERENCE TO RELATED APPLICATION

This application claims priority to U.S. Provisional Application Ser. No. 62/867,903 filed Jun. 28, 2019, the disclosures of which are incorporated herein by reference in their entireties.

BACKGROUND

Field of Invention

The present invention relates to a display apparatus. More particularly, the present invention relates to a display apparatus including a wireless transmitting unit.

Description of Related Art

With the progress of technology, the development of wireless technology is gradually mature. The wireless technology includes near-field communication technology, which allows the two electronic apparatuses to communicate at close distance. However, in a product of the display apparatus equipped with the near-field communication technology, the circuits of the display apparatus may limit the signal transmission of an antenna of the near-field communication. Therefore, how to ensure the transmission efficiency of the antenna is an urgent problem to be solved in the art.

SUMMARY

The present disclosure provides a display apparatus which can prevent interference with the transmission of the wireless transmitting unit.

The present disclosure provides a display apparatus including a wireless transmitting unit and a display panel. The display panel includes a substrate, a plurality of pixel units and a signal line. The substrate includes a display region and a periphery region. The periphery region surrounds the display region. The pixel units are disposed on the display region. Each of the pixel units includes an active device and a pixel electrode. The active device is electrically connected to the pixel electrode. The signal line is on the periphery region. As viewed from a top view, the signal line has an annular shape with a gap and surrounds the display region.

In one embodiment of the present disclosure, the display apparatus further includes a driving chip. The driving chip transmits a common electric potential signal to the signal line.

In one embodiment of the present disclosure, the display region has a first side and a second side opposite the first side. The signal line has a first end and a second end separated with each other. A horizontal distance between the first end and the first side is substantially equal to a horizontal distance between the second end and the second side.

In one embodiment of the present disclosure, the display region has a third side and a fourth side opposite the third side. The third side and the fourth side are between the first side and the second side. The signal line surrounds the first side, the second side, the third side and a portion of the fourth side.

In one embodiment of the present disclosure, the signal line is line symmetrical with respect to a center line of the display region.

In one embodiment of the present disclosure, the display apparatus further includes an electrostatic discharge (ESD) protective circuit. The ESD circuit is on the periphery region. The ESD protective circuit surrounds the display region.

In one embodiment of the present disclosure, as viewed from a top view, the ESD protective circuit has an annular shape with a gap and surrounds the display region.

In one embodiment of the present disclosure, the signal line has a common electric potential (Vcom).

In one embodiment of the present disclosure, the display apparatus further includes a circuit device. The circuit device is outside the display region. The signal line is connected to the circuit device.

In one embodiment of the present disclosure, the signal line has a first end and a second end separated with each other. The signal line cascades the circuit device through the first end and the second end.

Based on above, the signal line of the display apparatus of the present disclosure is on the periphery region. As viewed from a top view, the signal line has an annular shape with a gap and surrounds the display region. Therefore, the signal line can be avoided from being a loop and interfere the transmission of the wireless transmitting unit, so that the transmission performance of the wireless transmitting unit is improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
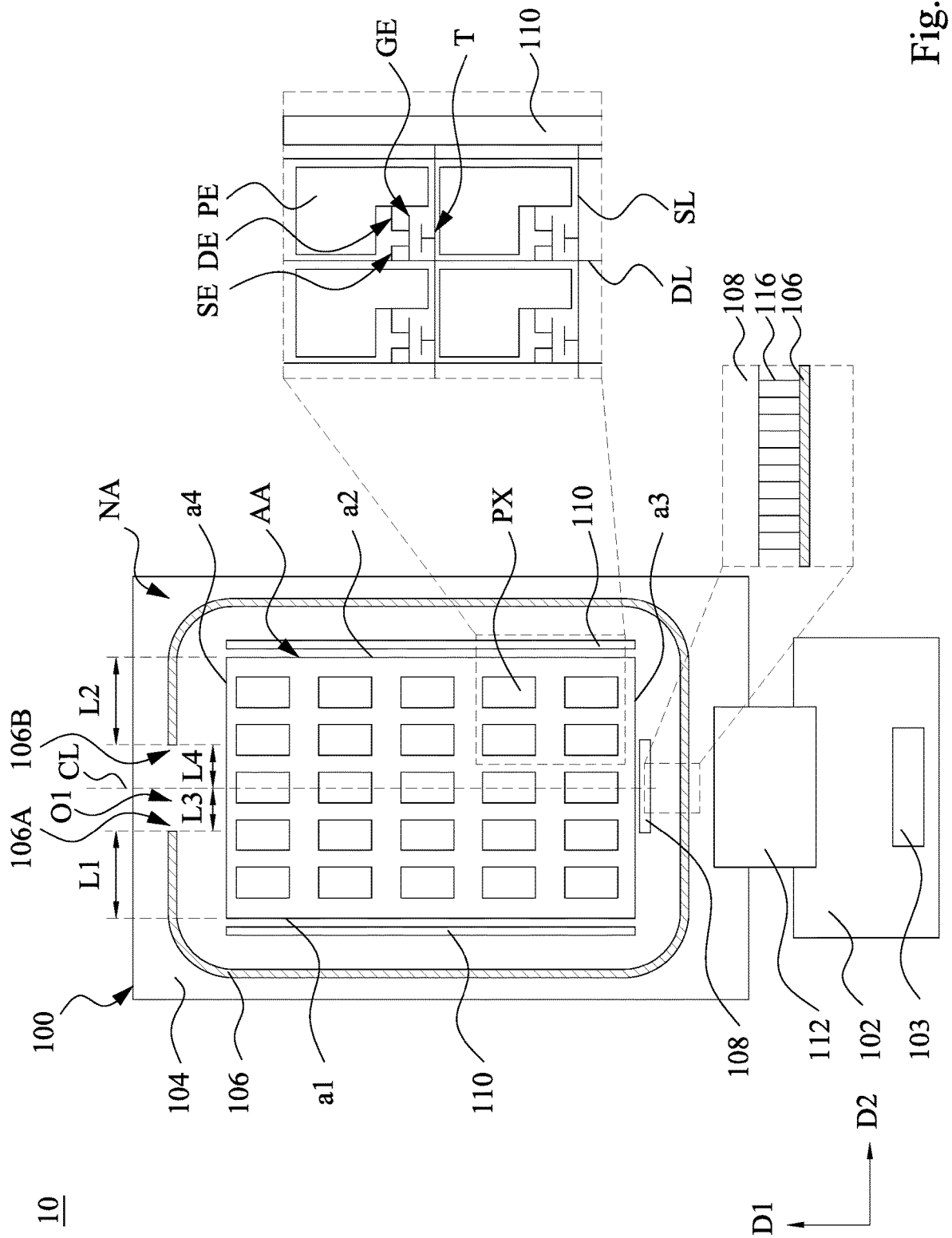
FIG. 1A is a top view of a display apparatus according to one embodiment of the present embodiment.

Reference will now be made in detail to the present embodiments of the invention, examples of which are illustrated in the accompanying drawings. Wherever possible, the same reference numbers are used in the drawings and the description to refer to the same or like parts.

FIG. 1A is a top view of a display apparatus 10 according to one embodiment of the present embodiment. Referring to FIG. 1A, the display apparatus 10 includes a display panel 100 and a wireless transmission unit 103. The wireless transmission unit 103 may be, but is not limited to, a wireless fidelity (Wi-Fi) module, a radio frequency identification (RFID) module, a bluetooth module, an infrared ray module, near-field communication (NFC) module or a device-to device (D2D) module. In some embodiments where the wireless transmission unit 103 is an NFC module, the wireless transmission unit 103 has an antenna structure.

The display apparatus 10 further includes a circuit board 102. The display panel 100 is on one side of the circuit board 102 and is connected to the circuit board 102. In the present embodiment, the wireless transmission unit 103 is disposed on, but is not limited to, the circuit board 102. In some other embodiments, the wireless transmission unit 103 may be disposed on the display panel 100.

The display panel 100 includes a substrate 104, a plurality of pixel units PX and a signal line 106. The substrate 104 includes a display region AA and a periphery region NA. The periphery region NA surrounds the display region AA. The pixel units PX are disposed on the display region AA. Each of the pixel units PX includes an active device T and a pixel electrode PE. The active device T is electrically connected to the pixel electrode PE.

The display panel 100 further includes data lines DL and scan lines SL disposed on the display region AA. In the present embodiment, the data lines DL intersect with the scan lines SL. For example, the data lines DL extend along a first direction D1 and the scan lines SL extend along a second direction D2. The present disclosure, however, is not limited thereto. In the present embodiment, the pixel units PX are arranged in an array. The active device T is, for example, a thin film transistor and has a source SE, a drain DE and a gate GE. The source SE of the active device T is electrically connected to the corresponding data line DL. The gate GE of the active device T is electrically connected to the scan line SL. The drain DE of the active device T is electrically connected to the corresponding pixel electrode PE. The display apparatus 10 further includes a driving chip 108 disposed on the periphery region NA. The pixel units PX are electrically connected to the driving chip 108 through the data lines DL. In the present embodiments, the driving chip 108 is, for example, a source driving chip.

In the present embodiment, considering the conductivity, materials of the gate GE, the source SE and the drain DE of the active device T, the data lines DL and the scan lines SL are generally, but is not limited to, a metal material. In some other embodiments, the gate GE, the source SE and the drain DE of the active device T, the data lines DL, and the scan lines SL may be other conductive materials such as alloys, metal nitrides, metal oxides, metal oxynitrides, other suitable materials, or a stacked layer of a metal material and other conductive materials. The material of the substrate 104 may include glass, quartz, polymer material (e.g., polyimide, benzocyclobutene, polycarbonate or other suitable materials), other suitable materials, or a combination of at least two thereof.

In the present embodiment, the pixel electrode PE may optionally be a transparent electrode. The material of the transparent electrode includes metal oxides such as indium tin oxide (ITO), indium zinc oxide (IZO), aluminum tin oxide, aluminum zinc oxide, other suitable oxides, or a stacked layer of at least two thereof. The present disclosure, however, is not limited thereto. In other embodiments, the pixel electrode PE may be a reflective electrode or a combination of the reflective electrode and a transparent electrode.

In the present embodiment, the display panel 100 can optionally include a driving circuit 110. The driving circuit 110 is disposed on the periphery region NA and electrically connected to at least a portion of the scan lines SL. For example, the driving circuit 110 may be a gate driver on array (GOA). That is, active devices (not shown) of the driving circuit 110 and the active device T of the pixel unit PX are formed in the same process, but the present disclosure is not limited thereto.

The signal line 106 is disposed on the periphery region NA. The signal line 106 has a predetermined electric potential. For example, the signal line 106 has a common electric potential (Vcom) or may have a floating electric potential, a constant electric potential, a ground electric potential or an adjustable electric potential. An electric potential difference between a display driving electric potential of each pixel electrode PE and the common electric potential (Vcom) can be applied on a display medium (not shown, for example, a liquid crystal molecule, an electrophoresis display medium or other suitable medium) of the display apparatus 10 such that each pixel unit PX has a corresponding brightness and can display image. The signal line 106 surrounds the display region AA. For example, the display region AA has a first side a1 and a second side a2 opposite the first side a1. For example, the first side a1 and the second side a2 are substantially parallel to the first direction D1. The display region AA further has a third side a3 and a fourth side a4 opposite the third side a3. The third side a3 is substantially parallel to the second direction D2. The signal line 106 surrounds at least three of the first side a1, the second side a2, the third side a3 and the fourth side a4. Therefore, a uniformity of the display image of the display region AA can be improved and an electrostatic discharge is prevented.

In the present embodiment, the signal line 106 further has an opening O1. In other words, a portion of the signal line 106 is disconnected. For example, a normal projection of the signal line 106 on the substrate 104 has a C-shaped contour. In other words, as viewed from a top view, the signal line 106 has an annular shape having a gap and surrounds the first side a1, the second side a2, the third side a3 and a portion of the fourth side a4. In the present embodiment, the opening O1 is at, for example, the fourth side a4. In other words, the signal line 106 is discontinuous at the fourth side a4 of the display region AA. The signal line 106 has a first end 106A and a second end 106B opposite the first end 106A. The first end 106A and the second end 106B are separated with each other. In particular, the first end 106A and the second end 106B are physically separated. The display panel 100 further includes a center line CL passing through a center of the display region AA. For example, the first end 106A and the second end 106B of the signal line 106 are point symmetrical with respect to the center line CL of the display region AA. Therefore, the signal line 106 can be avoided from being a loop and interfere the transmission of the wireless transmission unit 103, so that the transmission performance of the wireless transmission unit 103 is improved. In some embodiments where the wireless transmission unit 103 is a near-field communication module, the transmission performance of the near-field communication can be improved. The signal line 106 is made of metal wire, thereby reducing the interference of the signal line 106 to the wireless transmission unit 103. In other embodiments, the signal line 106 has a grid structure. Therefore, the interference of the signal line 106 to the wireless transmission unit 103 is reduced.

Figure 1B:
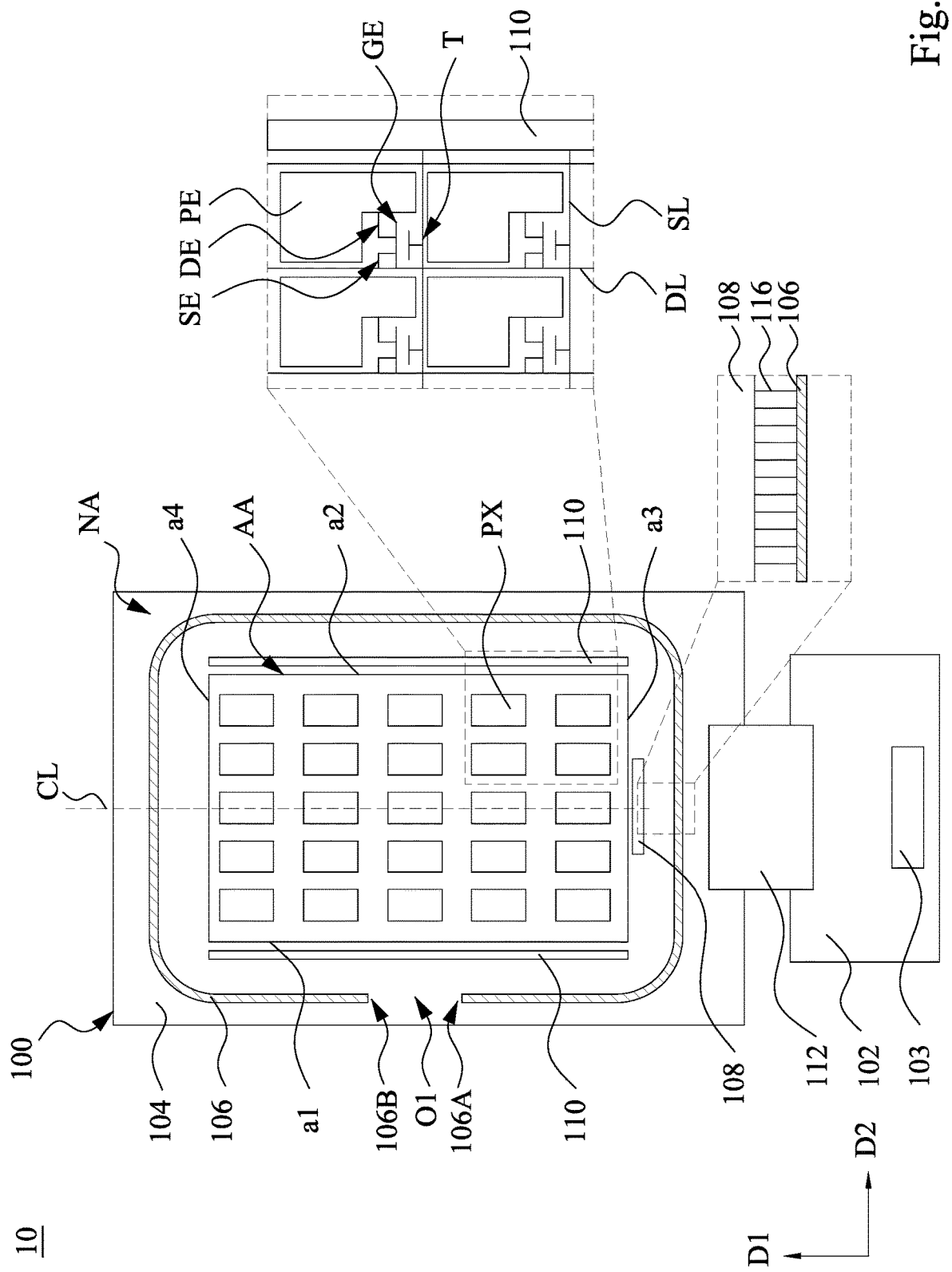
FIG. 1B is a top view of a display apparatus according to another embodiment of the present embodiment.
Figure 1C:
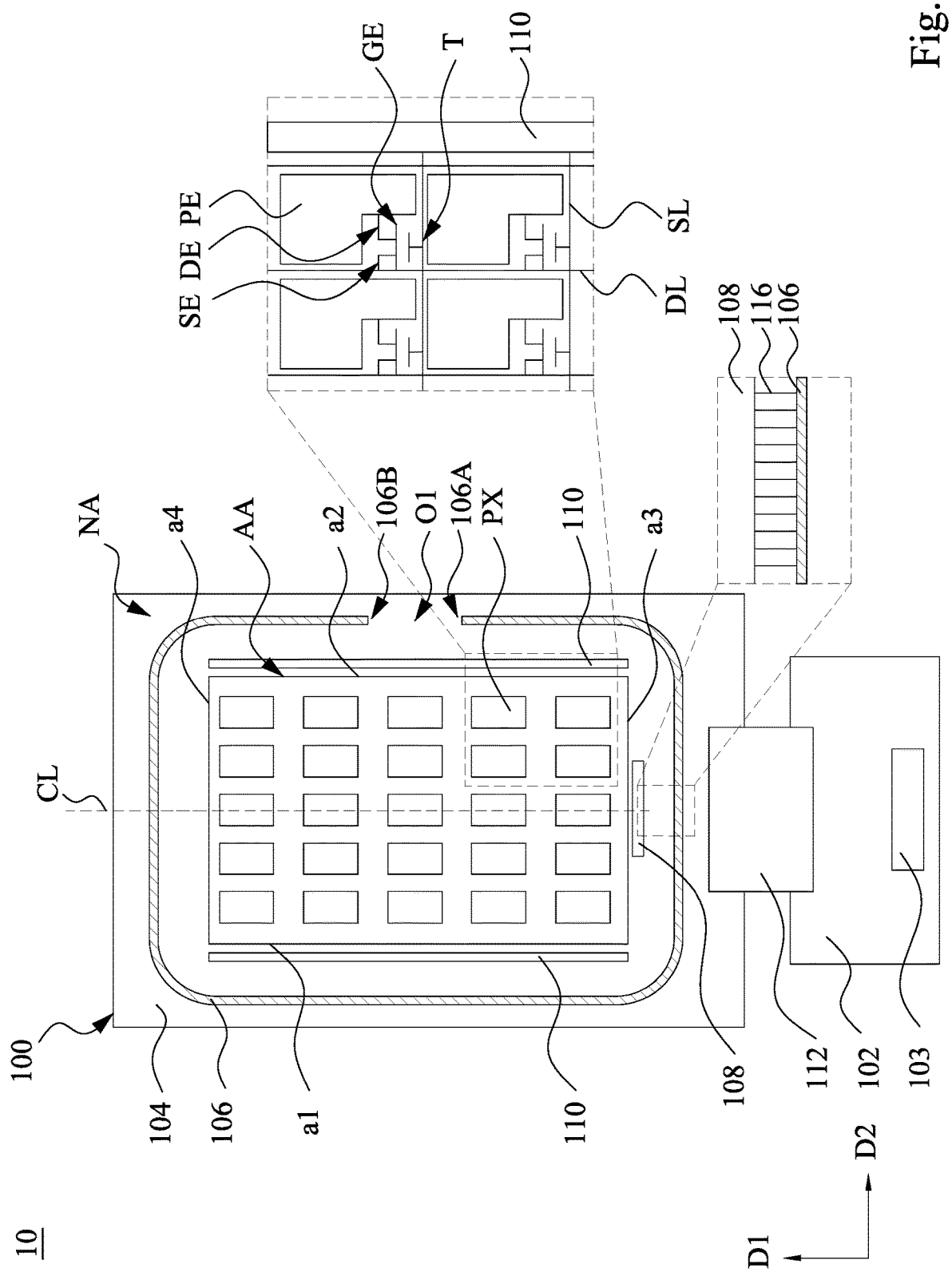
FIG. 1C is a top view of a display apparatus according to another embodiment of the present embodiment.
Figure 1D:
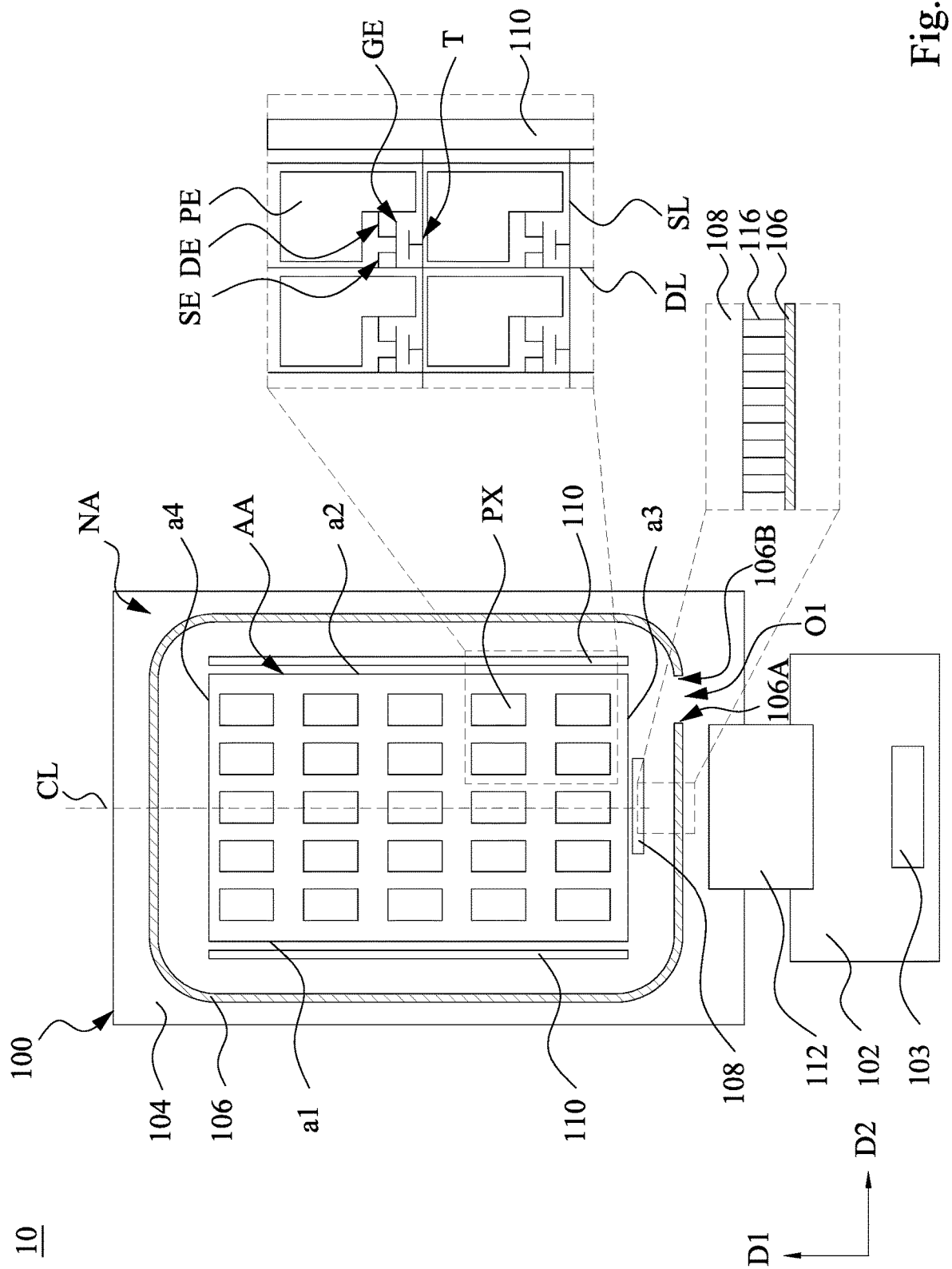
FIG. 1D is a top view of a display apparatus according to another embodiment of the present embodiment.

In some other embodiments, the signal line 106 may be asymmetrical with respect to the center line CL of the display region AA. For example, the opening O1 is at the second side a2 (see FIG. 1B). That is to say, the signal line 106 is discontinuous at the second side a2 of the display region AA. In other words, the first end 106A and the second end 106B are at the second side a2. In some other embodiments, the opening O1 is at the third side a3 (see FIG. 1C). That is, the signal line 106 is discontinuous at the third side a3 of the display region AA. In other words, the first end 106A and the second end 106B are at the third side a3. In some other embodiments, the opening O1 can be at the fourth side a4 (see FIG. 1D) and the opening O1 and the driving chip 108 are at the same side of the display region AA. That is, the signal line 106 is discontinuous at the fourth side a4 of the display region AA. In other words, the first end 106A and the second end 106B are at the fourth side a4.

The signal line 106 is line symmetrical with respect to the center line CL of the display region AA. For example, a horizontal distance L1 between the first end 106A and the first side a1 of the signal line 106 is substantially equal to a horizontal distance L2 between the second end 106B and the second side a2 of the signal line 106. In other words, a distance along the second direction D2 between the first end 106A and the first side a1 of the signal line 106 is substantially equal to a distance along the second direction D2 between the second end 106B and the second side a2 of the signal line 106. A horizontal distance L3 (e.g. a distance along the second direction D2) between the first end 106A of the signal line 106 and the center line CL is substantially equal to a horizontal distance L4 (e.g. a distance along the second direction D2) between the second end 106B of the signal line 106 and the center line CL. Therefore, uniformity of the display image of the display region AA can be improved.

The signal line 106 is electrically connected to the driving chip 108 through a plurality of traces 116. The driving chip 108 transmits the common electric potential (Vcom) signal to the signal line 106 through the traces 116. In the present embodiment, the display panel 100 further includes a flexible printed circuit (FPC) board 112. The common electric potential (Vcom) signal can be provided by a chip (not shown) on the FPC board 112. The FPC board 112 is disposed on the periphery region NA and is between the first side a1 and the second side a2. The FPC board 112 is between the circuit board 102 and the display panel 100. The signal line 106 is electrically connected to the circuit board 102 through, for example, the chip (not shown) on the FPC board 112.

Figure 2:
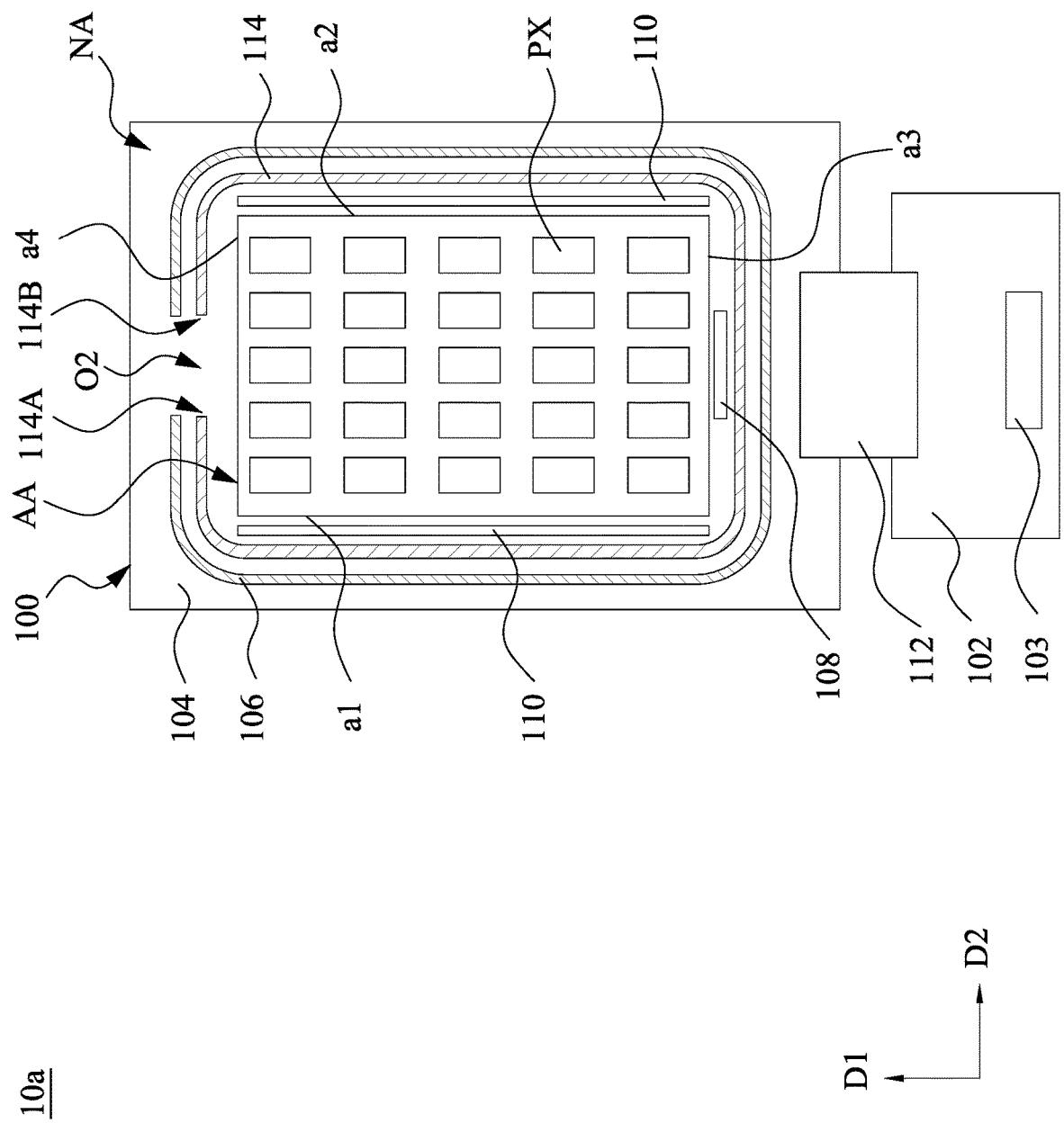
FIG. 2 is a top view of a display apparatus according to another embodiment of the present embodiment.

FIG. 2 is a top view of a display apparatus 10a according to another embodiment of the present disclosure. The main difference between the display apparatus 10a of FIG. 2 and the display apparatus 10 of FIG. 1A is that in the display apparatus 10a of the present embodiment, the display panel 100 further includes an electrostatic discharge (ESD) protective circuit 114. The ESD protective circuit 114 is on the periphery region NA. The ESD protective circuit 114 surrounds the display region AA and can protect other electrical devices from being damaged by an electrostatic discharge effect. In the present embodiment, the ESD protective circuit 114 further has an opening O2. In other words, a portion of the ESD protective circuit 114 is disconnected. For example, a normal projection of the ESD protective circuit 114 on the substrate 104 has a C-shaped contour. As viewed from a top view, the ESD protective circuit 114 has an annular shape having a gap and surrounds the first side a1, the second side a2, the third side a3 and a portion of the fourth side a4. In the present embodiment, the opening O2 is at, for example, the fourth side a4. The ESD protective circuit 114 has a third end 114A and a fourth end 114B opposite the third end 114A. The third end 114A and the fourth end 114B are separated with each other. In particular, the third end 114A and the fourth end 114B are physically separated. Therefore, the ESD protective circuit 114 can be avoided from being a loop and interfere the transmission of the wireless transmission unit 103, so that the transmission performance of the wireless transmission unit 103 is improved. In some embodiments where the wireless transmission unit 103 is a near-field communication module, the transmission performance of the near-field communication can be improved.

Figure 3:
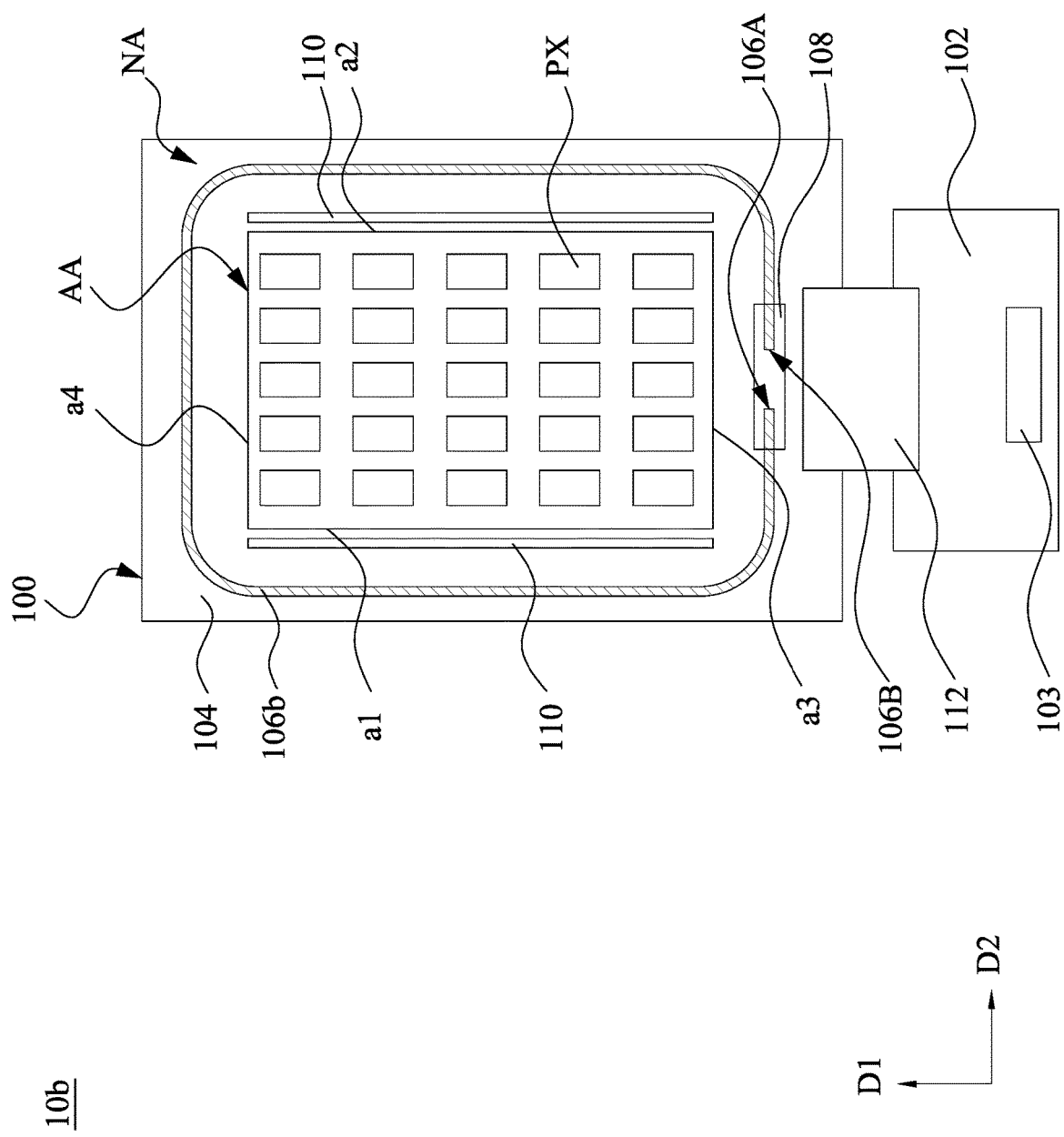
FIG. 3 is a top view of a display apparatus according to another embodiment of the present embodiment.

FIG. 3 is a top view of a display apparatus 10b according to another embodiment of the present embodiment. The main difference between the display apparatus 10b of FIG. 3 and the display apparatus 10 of FIG. 1A is that in the display apparatus 10b of the present embodiment, the first end 106A and the second end 106B of the signal line 106b are connected to and in contact with two ends of the driving chip 108, respectively. But in an internal design of the driving chip 108, the first end 106A and the second end 106B are disconnected. That is, an opening (not shown) is formed inside the driving chip 108 and the first end 106A and the second end 106B have the same electric potential. The circuit board 102 and the FPC board 112 are outside a loop structure formed by the signal line 106b and the driving chip 108. In the present embodiment, the driving chip 108 transmits a first signal to the first end 106A and transmits a second signal to the second end 106B. The first signal and the second signal have the same predetermined electric potential. Since the first signal and the second signal are not loop circuit, the signal line 106b do not interfere with the transmission of the wireless transmission unit 103, so that the transmission performance of the wireless transmission unit 103 is improved. For the convenience of description, the ESD protective circuit 114 is omitted in FIG. 3.

Figure 4:
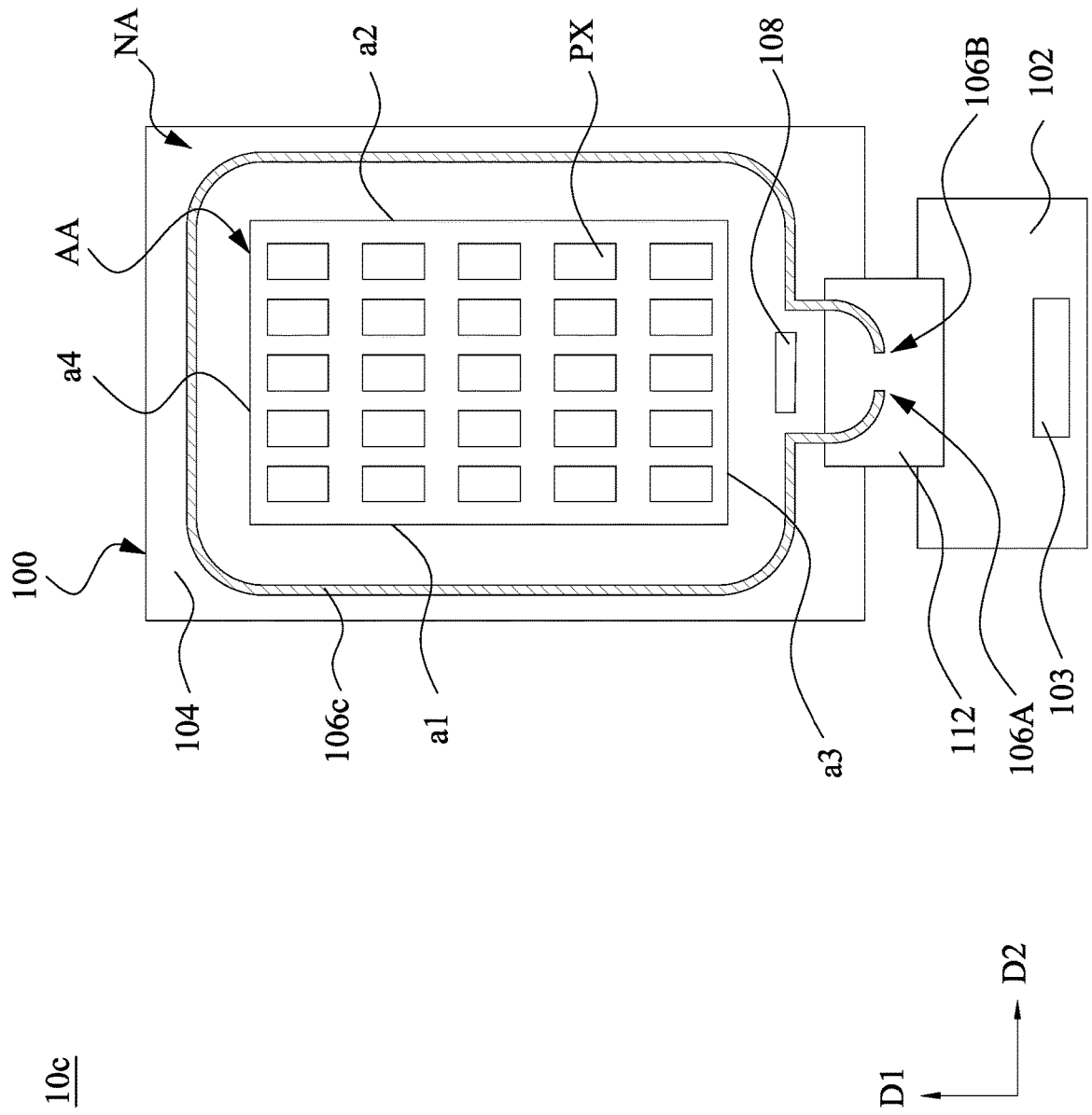
FIG. 4 is a top view of a display apparatus according to another embodiment of the present embodiment.

FIG. 4 is a top view of a display apparatus 10c according to another embodiment of the present embodiment. The main difference between the display apparatus 10c of FIG. 4 and the display apparatus 10 of FIG. 1A is that in the display apparatus 10c of the present embodiment, the first end 106A and the second end 106B of the signal line 106c are on the FPC board 112 and electrically connected to and in contact with the FPC board 112. Therefore, the signal line 106c forms a loop structure with and cascades the FPC board 112. But in an internal design of the FPC board 112, the first end 106A and the second end 106B are disconnected. That is, an opening (not shown) is formed in the FPC board 112 and the first end 106A and the second end 106B have the same electric potential. In the present embodiment, the FPC board 112 transmits a first signal to the first end 106A and transmits a second signal to the second end 106B. Since the first signal and the second signal are not loop circuit, the signal line 106c do not interfere with the transmission of the wireless transmission unit 103, so that the transmission performance of the wireless transmission unit 103 is improved. For the convenience of description, the driving circuit 110 and the ESD protective circuit 114 are omitted in FIG. 4.

Figure 5:
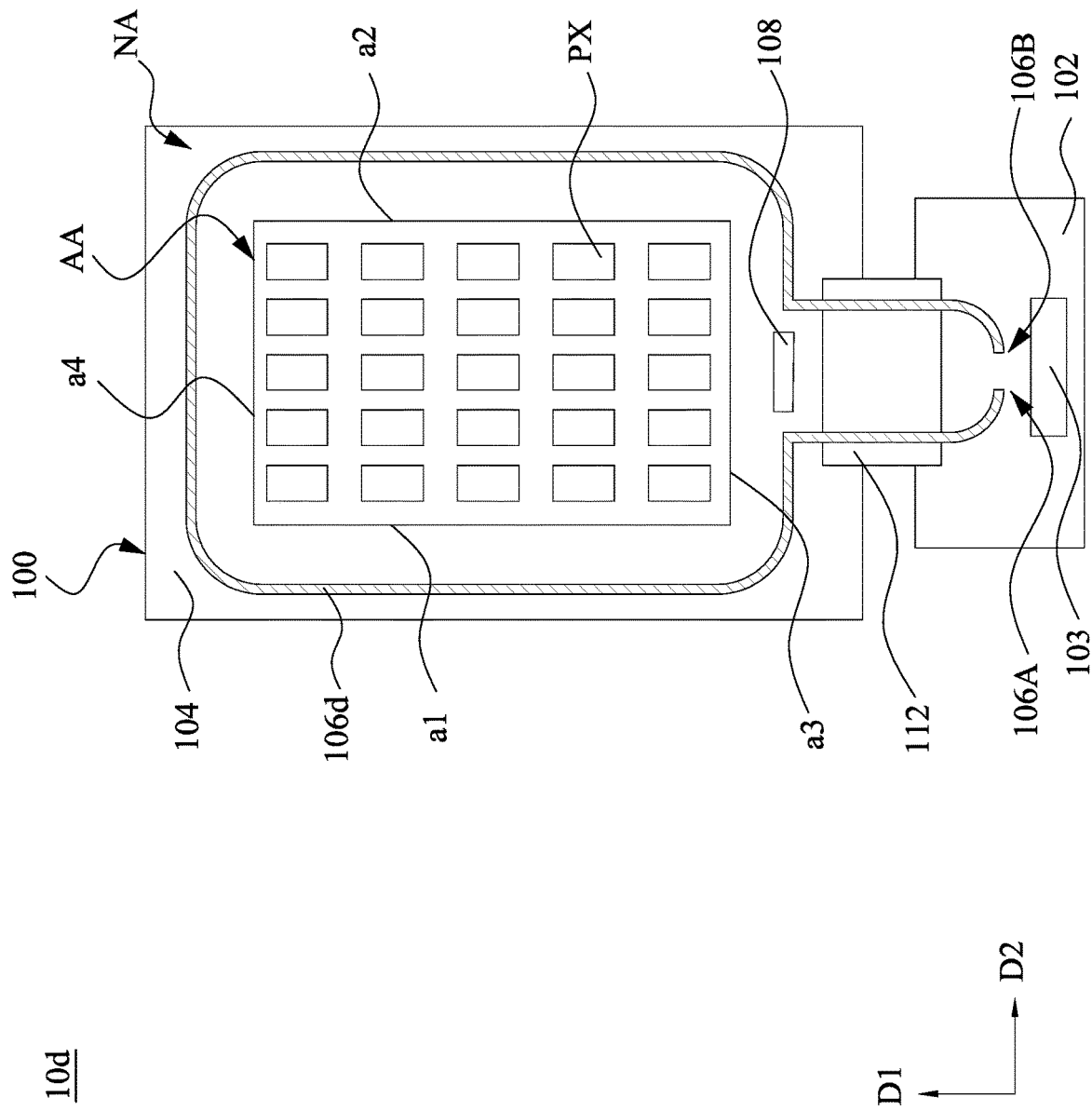
FIG. 5 is a top view of a display apparatus according to another embodiment of the present embodiment.

FIG. 5 is a top view of a display apparatus 10d according to another embodiment of the present embodiment. The main difference between the display apparatus 10d of FIG. 5 and the display apparatus 10 of FIG. 1A is that in the display apparatus 10d of the present embodiment, the signal line 106d overlaps the FPC board 112 and extends to be in contact with the circuit board 102. For example, the first end 106A and the second end 106B are on the circuit board 102 and electrically connected to and in contact with the circuit board 102. Therefore, the signal line 106d forms a loop structure with and cascades the circuit board 102. But in an internal design of the circuit board 102, the first end 106A and the second end 106B are disconnected. That is, an opening (not shown) is formed in the circuit board 102 and the first end 106A and the second end 106B have the same electric potential. In the present embodiment, the circuit board 102 transmits a first signal to the first end 106A and transmits a second signal to the second end 106B. Since the first signal and the second signal are not loop circuit, the signal line 106*d* do not interfere with the transmission of the wireless transmission unit 103, so that the transmission performance of the wireless transmission unit 103 is improved. For the convenience of description, the driving circuit 110 and the ESD protective circuit 114 is omitted in FIG. 5.

Based on above, a normal projection of the signal line of the display apparatus of the present disclosure on the substrate has a C-shaped contour. In other words, the signal line surrounds the first side, the second side, the third side and a portion of the fourth side of the display region. The signal line has a first end and a second end opposite the first end. The first end and the second end are separated with each other. Therefore, the signal line can be avoided from being a loop and interfere with the transmission of the wireless transmission unit, so that the transmission performance of the wireless transmission unit is improved. For example, in some embodiments where the wireless transmission unit is a near-field communication module, the transmission performance of the near-field communication can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display apparatus, comprising:
   a wireless transmission unit; and
   a display panel, wherein the display panel comprises:
   a substrate comprising a display region and a periphery region, wherein the periphery region surrounds the display region;
   a plurality of pixel units disposed on the display region, wherein each of the pixel units comprises an active device and a pixel electrode, and the active device is electrically connected to the pixel electrode; and
   a signal line on the periphery region, wherein as viewed from a top view, the signal line has an annular shape with a gap and surrounds the display region, the signal line has a first end and a second end facing each other defining the gap, the gap is narrower than a horizontal width of the display region, and each of the first end and the second end of the signal line is free from being in direct contact with any other signal line and any one of an integrated circuit chip and a flexible printed circuit board.

2. The display apparatus of claim 1, further comprising:
   a driving chip, wherein the driving chip transmits a common electric potential signal to the signal line.

3. The display apparatus of claim 1, wherein the display region has a first side and a second side opposite the first side, the first end and the second end of the signal line are separated with each other, and a horizontal distance between the first end and the first side is substantially equal to a horizontal distance between the second end and the second side.

4. The display apparatus of claim 3, wherein the display region has a third side and a fourth side opposite the third side, the third side and the fourth side are between the first side and the second side, and the signal line surrounds the first side, the second side, the third side and a portion of the fourth side.

5. The display apparatus of claim 1, wherein the signal line is line symmetrical with respect to a center line of the display region.

6. The display apparatus of claim 1, further comprising:
   an electrostatic discharge (ESD) protective circuit on the periphery region, wherein the ESD protective circuit surrounds the display region.

7. The display apparatus of claim 6, wherein as viewed from a top view, the ESD protective circuit has an annular shape with a gap and surrounds the display region.

8. The display apparatus of claim 1, wherein the signal line has a common electric potential (Vcom).

9. The display apparatus of claim 1, further comprising:
   a circuit device outside the display region, wherein the signal line is connected to the circuit device.

10. The display apparatus of claim 9, wherein the first end and the second end are separated with each other, and the signal line cascades the circuit device through the first end and the second end.

* * * * *